US009961968B1

(12) United States Patent
Mulcahy (10) Patent No.: US 9,961,968 B1
(45) Date of Patent: May 8, 2018

(54) SLEEVE FOR A KEY FOB AND METHOD FOR MANUFACTURING SAME

(71) Applicant: David E Mulcahy, The Villages, FL (US)

(72) Inventor: David E Mulcahy, The Villages, FL (US)

(*) Notice: Subject to any disclaimer, the term of this patent is extended or adjusted under 35 U.S.C. 154(b) by 0 days. days.

(21) Appl. No.: 15/669,946

(22) Filed: Aug. 6, 2017

Related U.S. Application Data (60) Provisional application No. 62/498,528, filed on Dec. 28, 2016.

(51) Int. Cl.
*A45C 11/32* (2006.01)
*A44B 15/00* (2006.01)
*H05K 9/00* (2006.01)
*G06K 19/073* (2006.01)

(52) U.S. Cl.
CPC .......... *A44B 15/005* (2013.01); *A45C 11/32* (2013.01); *G06K 19/07327* (2013.01); *H05K 9/0043* (2013.01)

(58) Field of Classification Search
CPC ..... A45C 11/32; A45C 11/323; A45C 11/321; A44B 15/005; G06K 11/32; H05K 9/0043
USPC .... 206/37.1–37.8, 38.1, 701, 709, 719, 720, 206/721, 722, 723, 724, 320
See application file for complete search history.

(56) References Cited

U.S. PATENT DOCUMENTS

| | | | | |
|---|---|---|---|---|
| 4,660,792 A * | 4/1987 | Rogalski | ............... | H01H 9/025 248/174 |
| 5,533,809 A * | 7/1996 | Gorman | ............... | B65D 33/14 206/320 |
| 6,347,796 B1 * | 2/2002 | Grossman | ............... | A63F 13/02 206/315.1 |
| 6,612,432 B2 * | 9/2003 | Motson | ............... | A45F 5/00 206/305 |
| 6,805,236 B1 * | 10/2004 | Caruso | ............... | A45C 11/329 206/1.5 |
| 6,948,614 B1 * | 9/2005 | Hall | ............... | A45C 11/329 150/154 |
| 7,036,642 B2 * | 5/2006 | Hoberman | ............... | A45C 13/02 190/109 |
| 7,075,798 B2 | 7/2006 | Hendrickson | | |
| 7,597,225 B2 * | 10/2009 | Badillo | ............... | A45C 9/00 224/191 |
| 7,810,683 B2 * | 10/2010 | Chan | ............... | A45F 5/00 224/221 |
| 8,479,922 B2 | 7/2013 | Kennedy | | |
| 9,460,309 B2 | 10/2016 | Zar et al. | | |
| 2004/0251285 A1 * | 12/2004 | O'Neill | ............... | A45F 5/00 224/221 |
| 2007/0034406 A1 | 2/2007 | Schroader | | |

(Continued)

OTHER PUBLICATIONS

Mission Darkness, Mission Darkness Faraday Bag for Keyfobs—5th Gen Shielding for Law Enforcement and Military, viewed at http://www.amazon.com on Feb. 21, 2017.

(Continued)

*Primary Examiner* — Jacob K Ackun
*Assistant Examiner* — Jenine Pagan
(74) *Attorney, Agent, or Firm* — Law Office of Steven R. Olsen, PLLC; Steven R. Olsen (57) ABSTRACT

The invention provides an improved sleeve for a key fob with Radio Frequency (RF) blocking features to block undesired communications with the key fob.

8 Claims, 11 Drawing Sheets

(56) References Cited

U.S. PATENT DOCUMENTS

| | | | |
|---|---|---|---|
| 2007/0246386 A1* | 10/2007 | Nykoluk | A45C 7/0095 |
| | | | 206/320 |
| 2008/0017678 A1* | 1/2008 | Anderson | A44C 5/003 |
| | | | 224/221 |
| 2010/0230018 A1 | 9/2010 | Nielsen | |
| 2011/0290676 A1 | 12/2011 | Kershenstein | |
| 2012/0061134 A1 | 3/2012 | Kennedy | |
| 2012/0114270 A1 | 5/2012 | Roberts | |
| 2015/0201531 A1 | 7/2015 | Hilburn, Sr. | |
| 2016/0042202 A1* | 2/2016 | Murray | H02J 7/0042 |
| | | | 320/108 |
| 2016/0078700 A1 | 3/2016 | Yeh et al. | |
| 2017/0208905 A1* | 7/2017 | Viskup | A44B 15/005 |

OTHER PUBLICATIONS

Silent Pocket, Silent Pocket Key Fob Guard Protector for Wireless Car Keys—RFID Blocking Faraday Cage, viewed at http://www.amazon.com on Feb. 21, 2017.

Theroyalflush, Key Fob Holder—RFID Blocking Bag—Protect Against Signal Relay, viewed at http://www.eBay.com/ on Feb. 21, 2017.

Silent Pocket, Bi-Fold Wallet, viewed at https://silent-pocket.com/ on Feb. 21, 2017.

Silent Pocket, Signal Shield RFID Protection Card, viewed at https://silent-pocket.com/ on Feb. 21, 2017.

* cited by examiner

| LAYER | Embodiment 1 | Embodiment 2 | Embodiment 3 | Embodiment 4 | Embodiment 5 |
|---|---|---|---|---|---|
| 1 | leather | leather | fabric | vinyl | plastic |
| 2 | plastic | plastic | plastic | paper | aluminum foil |
| 3 | aluminum foil | aluminum foil | aluminum foil | aluminum foil | Cu/Ni mesh |
| 4 | Cu/Ni mesh | Cu/Ni mesh | Cu/Ni mesh | Cu/Ni mesh | Cu/Ni mesh |
| 5 | Cu/Ni mesh | Cu/Ni mesh | Cu/Ni mesh | Cu/Ni mesh | |
| 6 | fabric | | | | |

Columns labeled: 1305, 1310, 1315, 1320, 1325, 1330

SLEEVE FOR A KEY FOB AND METHOD FOR MANUFACTURING SAME

CROSS-REFERENCE TO RELATED APPLICATIONS

This application claims the benefit of U.S. provisional application No. 62/498,528 filed on Dec. 28, 2016.

BACKGROUND

Field of Invention

The invention relates generally to an improved case. More specifically, but not by way of limitation, embodiments of the invention provide an improved sleeve for a key fob with Radio Frequency (RF) blocking features.

Description of the Related Art

Figure 1:
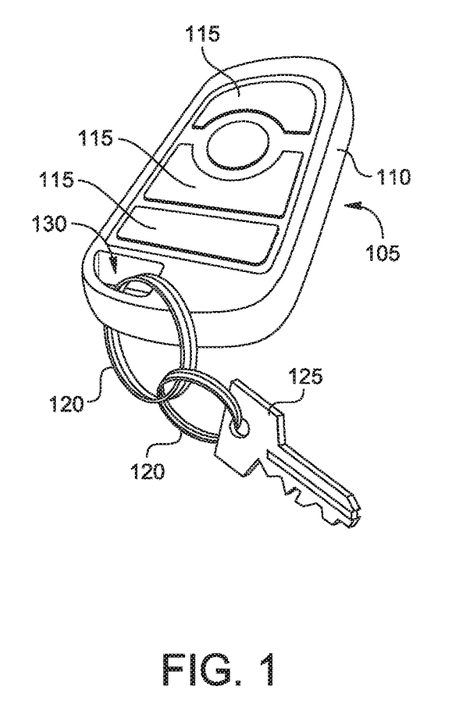
FIG. 1 is a perspective view of a key fob, according to the prior art.

As used herein, a key fob (or smart key) is an electronic device for controlling access to an automobile or other physical asset. An example key fob is illustrated in FIG. 1, where a key fob 105 includes a body 110, buttons 115, and a ring hole 130. Each of the buttons 115 may activate, for instance, a door lock, a trunk release, or a panic alarm in an automobile. Typically, one or more split rings 120 cooperate with the ring hole 130 to retain one or more physical keys 125.

Figure 2:
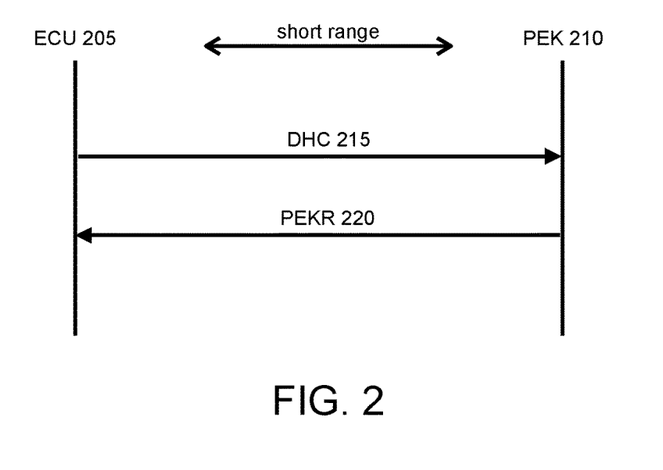
FIG. 2 is a communication diagram, according to the prior art.

FIG. 2 illustrates an intended call-response chain between an Electronic Control Unit (ECU) 205 of an automobile and a Passive Entry Key (PEK, i.e. a key fob 105 or other smart key) 210. Upon touching (or sometimes only upon lifting) a door handle of the automobile, the ECU 205 transmits a Door Handle Call (DHC) signal 215 to the PEK 210. In response to an expected DHC signal 215, the PEK 210 automatically returns a PEK Response (PEKR) signal 220 to the ECU 205. Upon receipt of an expected PEKR signal 220, the ECU 205 will, for example, cause a driver's door to unlock and/or generate an engine start enable (ESE) signal. Each instance of DHC signal 215 may be uniquely encoded. Likewise, the expected PEKR signal 220 may also be encoded, for instance using data from the DHC signal 215. Moreover, the communication link between the ECU 205 and the PEK 210 is generally optimized (by transmission power level and antenna design choices) for very short range communications. A designed link distance of a few feet is typical.

Protective cases for key fobs are generally known. Such key fob cases many be manufactured, for example, from leather or vinyl. Many such cases have a substantial shortcoming, however. For instance, while conventional key fob cases may protect a key fob by resisting physical abrasions and shock, they may not provide adequate protections against unauthorized access to electronic communications discussed above with reference to FIG. 2. Improved key fob cases are therefore needed.

SUMMARY OF THE INVENTION

The invention seeks to overcome the shortcoming described above by providing an improved sleeve for a key fob. In particular, embodiments of the invention provide a key fob sleeve with one or more metallic layers to block unauthorized RF signals.

DESCRIPTION OF THE DRAWINGS

An embodiment of the invention is illustrated in the drawings, wherein.

DETAILED DESCRIPTION

This section further discusses security threats with reference to FIGS. 3-6, and describes embodiments of the key fob sleeve and associated manufacturing process with reference to FIGS. 7-15. Such embodiments are meant to be illustrative and not restrictive. In the drawings, reference designators are reused for the same or similar features. Features in the figures are not necessarily drawn to scale. Some features illustrated in the drawings may be exaggerated in scale. Other features may be simplified, omitted, or not specifically referenced for descriptive clarity.

Threat Discussion

As used herein, a threat is any action that could result in unauthorized access to, or control of, an automobile or other asset. Four different types of threats are described below with reference to FIGS. 3-6. Each type of threat interrupts the intended call-response chain described above, and can be executed even when the PEK 210 is a relatively long distance from the ECU 205.

Figure 3:
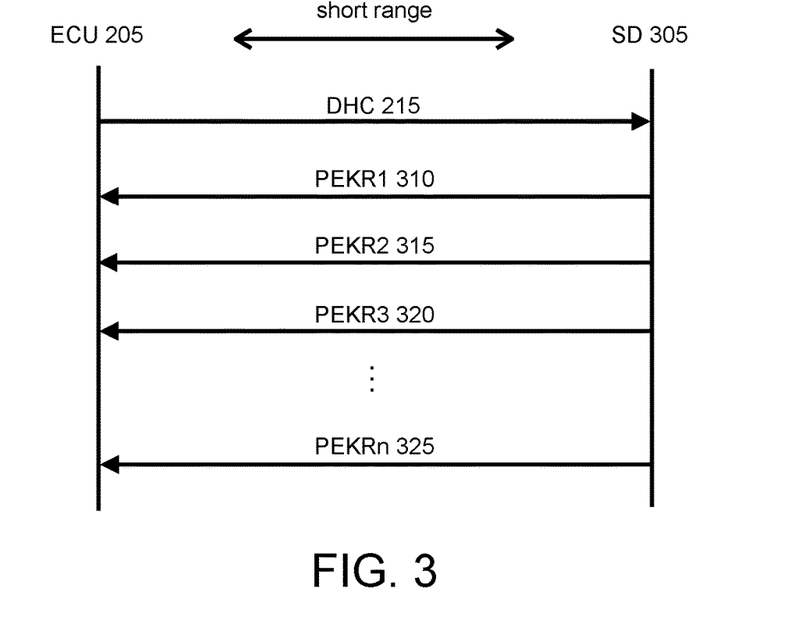
FIG. 3 is a communication diagram illustrating a first threat type.

FIG. 3 illustrates a brute force attack. In this scenario, an unauthorized person disposed near an automobile first touches (or lifts) a door handle to prompt transmission of DHC signal 215. Then, using a Spoofing Device (SD) 305, the unauthorized user transmits a series of signals PEKR1, PEKR2, PEKR3 . . . PEKRn (310, 315, 320 . . . 325, respectively) from SD 305 to the ECU 205 in an effort to guess an authentic (and expected) PEKR signal 220. If such brute force attack is successful, the ECU 205 will cause a driver's door to unlock and/or generate an ESE signal.

There are inherent weaknesses in the brute force attack described with reference to FIG. 3, however. For example, a relatively large amount of time (e.g., several minutes) may be required to audition each signal in the series of signals PEKR1, PEKR2, PEKR3 ... PEKRn (310, 315, 320 ... 325, respectively). This large amount of time increases a likelihood the unauthorized person will be detected. In addition, automobile manufacturers may easily safeguard against such an attack by configuring the ECU 205 to only consider PEKR signals 220 received within a narrow window of time (e.g., a few seconds) after transmitting the DHC signal 215. Because of such shortcomings associated with the brute force attack approach, the greatest threats to physical security of an automobile or other asset may involve unauthorized communications with the PEK 210 (i.e., key fob) as discussed below.

Figure 4A:
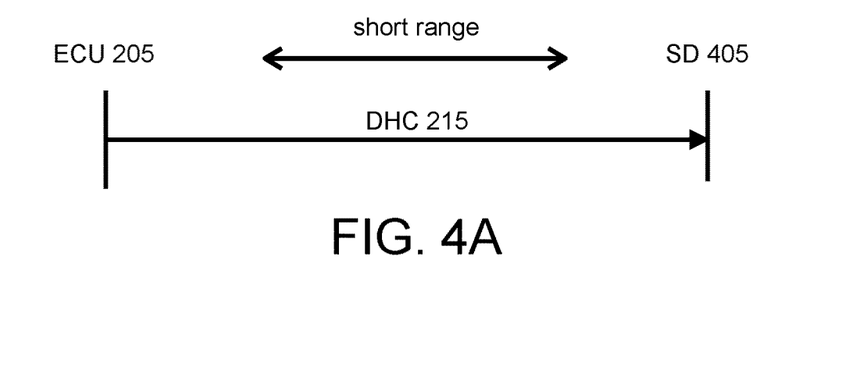
FIGS. 4A-4C are communication diagrams illustrating sequential steps of a second threat type.
Figure 4B:
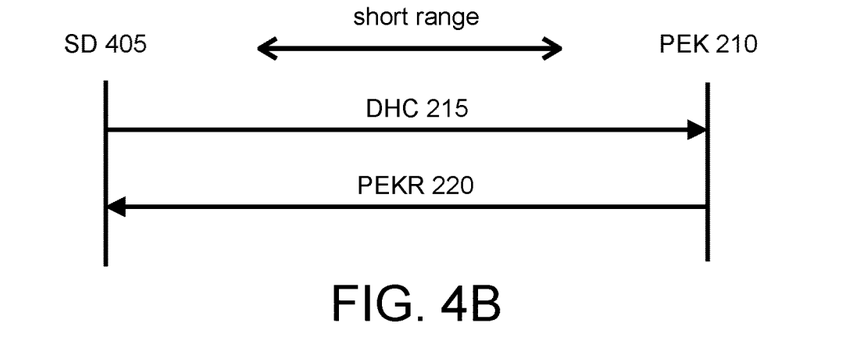
Figure 4C:
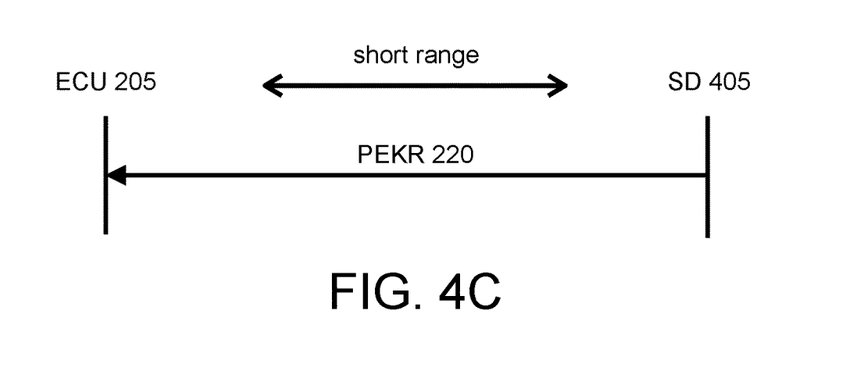

FIGS. 4A-4C are communication diagrams illustrating sequential steps of 3-step attack. In the 3-step attack, an unauthorized person uses a Spoofing Device (SD) 405 separately, and in close proximity, with the ECU 205 and with the PEK 210.

FIG. 4A illustrates that, in a first step, the unauthorized person disposed near an automobile touches (or lifts) a door handle to initiate transmission of DHC signal 215 to the SD 405. In a second step illustrated in FIG. 4B, the unauthorized person positions themselves in close range of the PEK 210. Using the SD 405, the unauthorized person transmits the DHC signal 215 to the PEK 210, and then receives the PEKR signal 220 from the PEK 210. Finally, the unauthorized person returns to close proximity to the ECU 205 to transmit the PEKR signal 220 to the ECU 205 from the SD 405.

While some vehicle access systems may be vulnerable to the 3-step attack described above with reference to FIGS. 4A-4C, a principle disadvantage is latency in the call-response chain due to necessary changes in the unauthorized person's physical location. Like the brute force attack described with reference to FIG. 3, automobile manufacturers can mitigate risk by only enabling a narrow window of time after transmitting DHC 215 in which to receive PEKR 220. The two threats described below are not as easily defeated by such counter measures, however.

Figure 5:
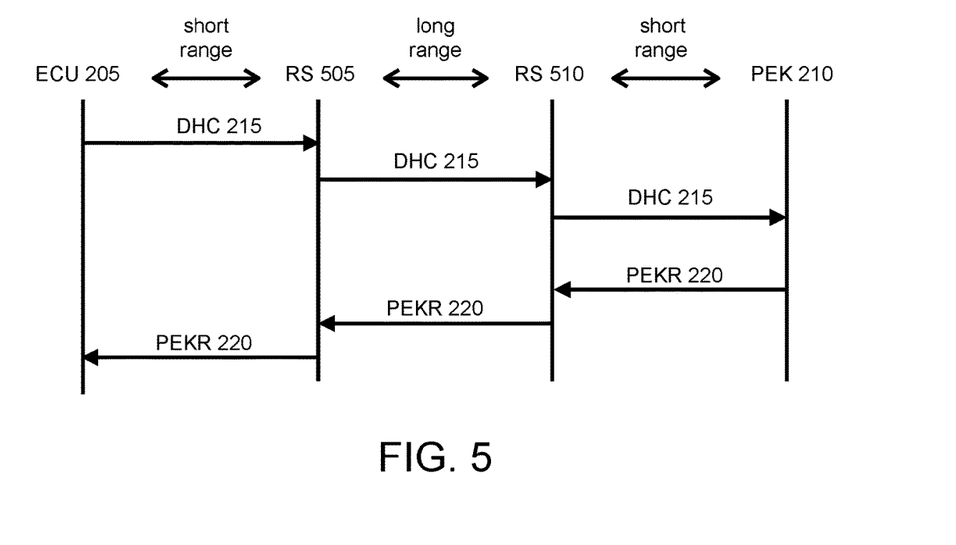
FIG. 5 is a communication diagram illustrating a third threat type.

FIG. 5 illustrates a twin-relay attack that substantially reduces latency in the call-response chain. This scenario disposes a first Relay Station (RS) 505 near the ECU 205, and a second Relay Station (RS) 510 near the PEK 210. RS 505 and RS 510 are configured to communicate with each other over relatively long distances (perhaps a hundred feet, or more). An unauthorized person initiates the attack by touching (or lifting) a door handle to initiate DHC signal 215. RS 505 and RS 510 relay DHC 215 to the PEK 210. RS 505 and RS 510 then relay PEKR 220 from PEK 210 to the ECU 205.

The twin-relay attack described above with reference to FIG. 5 either requires two unauthorized persons (one with each relay), or pre-positioning of relay RS 510. Nevertheless, latency in the call-response chain is significantly reduced compared to the brute force and 3-step attacks described above.

Figure 6:
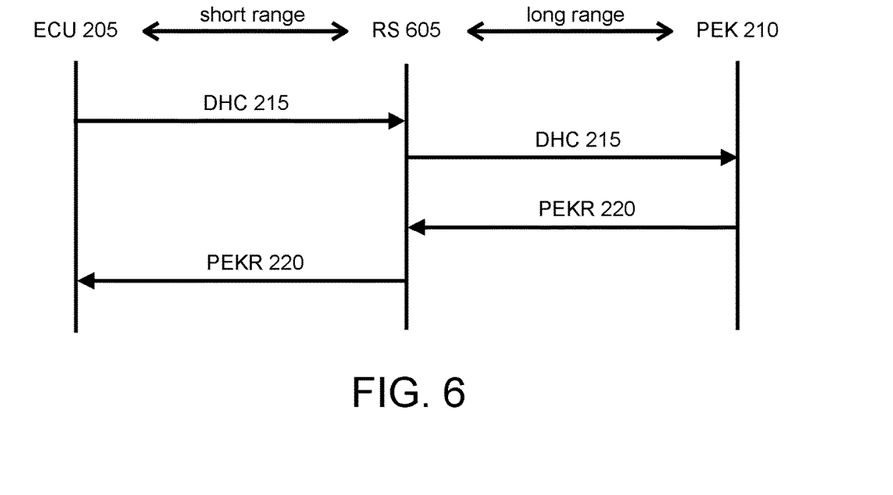
FIG. 6 is a communication diagram illustrating a fourth threat type.

FIG. 6 illustrates a single-relay attack that further reduces latency in the call-response chain. As shown therein, a single Relay Station (RS) 605 is disposed proximate to the ECU 205. An advantage of this attack (from the perspective of the attacker) is that it is not necessary to know precise location of the PEK 210. The unauthorized person initiates the DHC signal 215 by touching (or lifting) an automobile door handle; the RS 605 defeats security by relaying the DHC 215 and PEKR 220 signals over longer distances than intended.

The 3-step, twin-relay, and single-relay attacks described above each illustrate how unauthorized communications with a key fob might be used to breach security of an access control system for an automobile or other asset. Other attack types involving unauthorized communications with a key fob may also be possible. In view of such risks, embodiments of the invention provide a key fob sleeve configured to block unauthorized RF signals when an authorized user does not desire communications with the key fob.

Exemplary Sleeve

Figure 7:
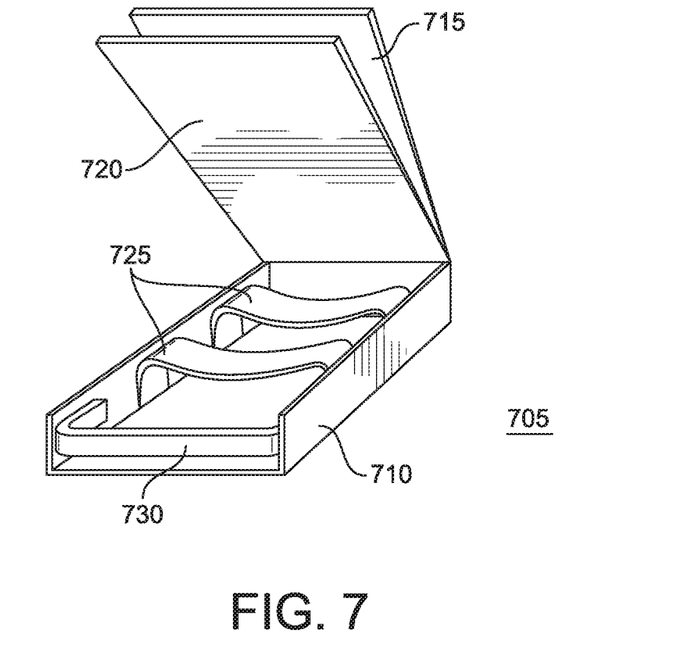
FIG. 7 is a perspective view of a key fob sleeve in a partially-open position, according to an embodiment of the invention.
Figure 8:
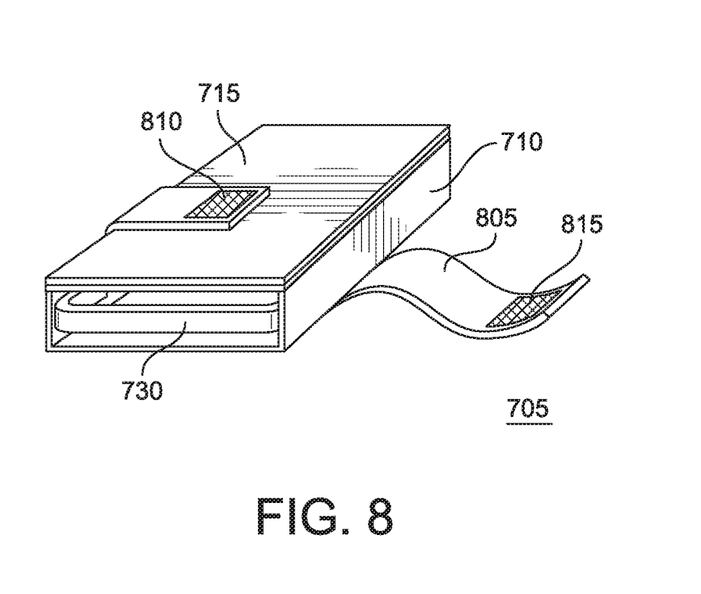
FIG. 8 is a perspective view of a key fob sleeve in a closed position, according to an embodiment of the invention.
Figure 9:
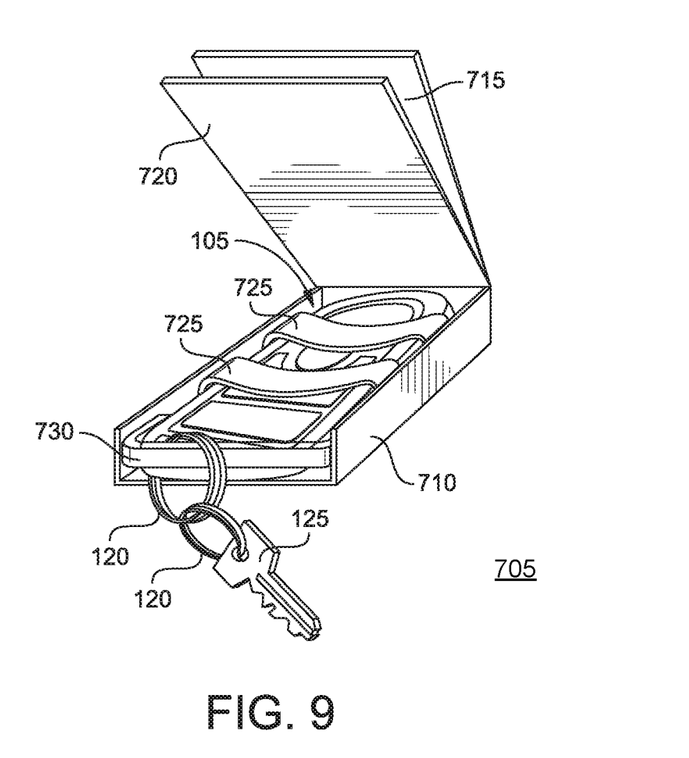
FIG. 9 is a perspective view of a key fob sleeve and key fob, the sleeve being in a partially-open position, according to an embodiment of the invention.
Figure 10:
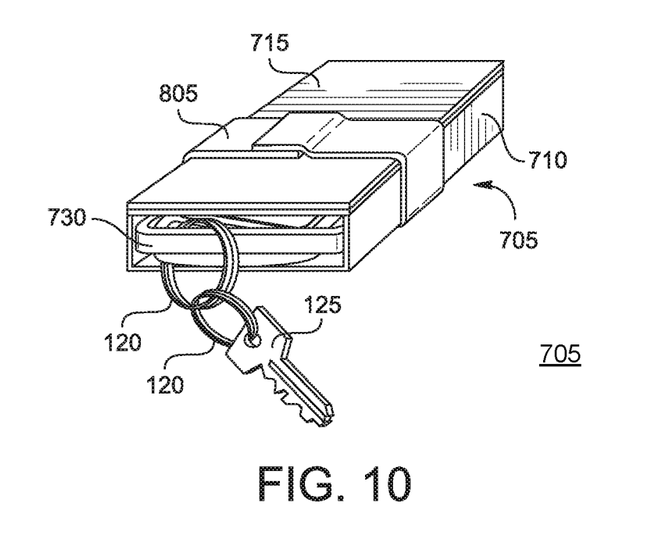
FIG. 10 is a perspective view of a key fob sleeve and key fob, the sleeve being in a closed position, according to an embodiment of the invention.

FIGS. 7 and 8 illustrate an embodiment of a key fob sleeve 705, according to an embodiment of the invention. FIGS. 9 and 10 illustrate the sleeve 705 retaining a key fob 105.

FIG. 7 is a perspective view of the sleeve 705 in a partially-open position. As shown therein, a sleeve 705 includes a base 710, a cover 715, a tongue 720, retention straps 725, and an end strap 730. As shown, the base 710 preferably includes a cavity defined by a rectangular floor and 3 side walls extending from the rectangular floor. The base 710, cover 715 and tongue 720 are preferably rigid or semi-rigid and sized to envelop a target key fob 105. The base 710, cover 715, and tongue 720 also each preferably have RF blocking characteristics to provide a Faraday cage when the sleeve 705 is in a closed position, as will be further described below. In typical automotive security applications, the Faraday cage is effective for blocking electromagnetic fields having a frequency in the range of 250 MHz to 5 GHz. Representative materials for construction of the base 710, cover 715, and tongue 720 are presented below with reference to FIG. 13. Retention straps 725 are preferably manufactured from elastic or are otherwise deformable. End strap 730 may be, for example, a strap or cord and may be permanently or removably secured to the base 710. FIG. 8 illustrates that the sleeve 705 can be secured in the closed position with a cover strap 805 that is affixed to the cover 715. Preferably, the cover strap 805 further includes a hook pad 810 and cooperating loop pad 815 to removably secure the cover strap 805 onto itself. As illustrated in FIG. 8, the sleeve 105 is substantially in the shape of a rectangular parallelepiped (i.e., a 3-dimensional box) when disposed in a closed position.

FIG. 9 is a perspective view of a key fob sleeve 705 and key fob 105, the sleeve 705 being in a partially-open position. Retention straps 725, end strap 730, and a split ring 120 (which may be, for instance, a conventional split key ring) cooperate to secure a key fob 105 in the sleeve 705. The cover strap 805 secures the cover 715 and the tongue 720 to a top surface of side walls in the base 710, as illustrated in FIG. 10.

Variations to the sleeve 705 illustrated in FIGS. 7-10 and described above are possible. For instance, although an overall box configuration may be preferable in many instances, other overall shapes for the sleeve 705 are possible, according to application needs and design choice. For some applications, the tongue 720 may not be required. In alternative embodiments, the end strap 730 may also include RF blocking properties to improve the effectiveness of the Faraday cage. A snap or other fastener could be used in place of hook & loop pads 810, 815.

In typical use, a key fob 105 is disposed in the sleeve 705. When a user desires communications between an ECU 205 (or other controller) and the key fob 105 (e.g., a PEK 210), the user opens the cover 715 and tongue 720 of the sleeve 705 (e.g., as depicted in FIG. 9). Otherwise, the user keeps the sleeve 705 in a closed position (as illustrated in FIG. 10);

in the closed configuration, the sleeve 705 acts as a Faraday cage to block RF communications with the fob 105.

Exemplary Manufacturing Process

An exemplary manufacturing process is described with reference to FIGS. 7-15. The process begins by cutting each component in step 1105. Cutting step 1105 can be further appreciated with reference to FIG. 12, illustrating components of the exemplary sleeve 705 after cutting step 1105.

Figure 11:
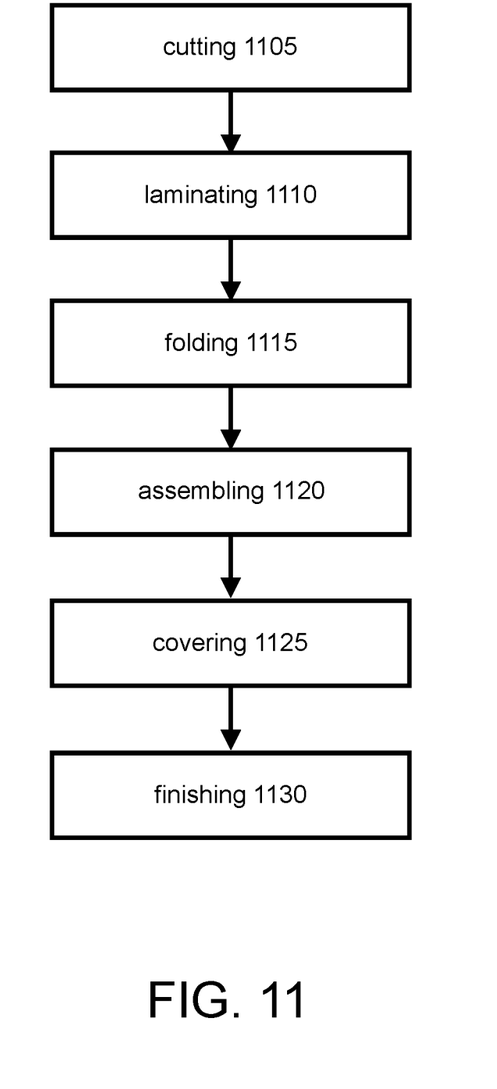
FIG. 11 is a flow diagram of a key fob sleeve manufacturing process, according to an embodiment of the invention.

In embodiments of the invention, certain components are enhanced by laminating step 1110. The purpose of laminating step 1110 is to provide multi-layered sub-assemblies, for instance for the each of the base 710, cover 715, and/or tongue 720. Accordingly, cutting step 1105 may include cutting more than one layer of material for one or more components illustrated in FIG. 12. Laminating step 1110 may include applying a suitable adhesive between adjacent layers of each multi-layered sub-assembly. Stitching or other joining processes could also be used, according to design choice.

Figure 12:
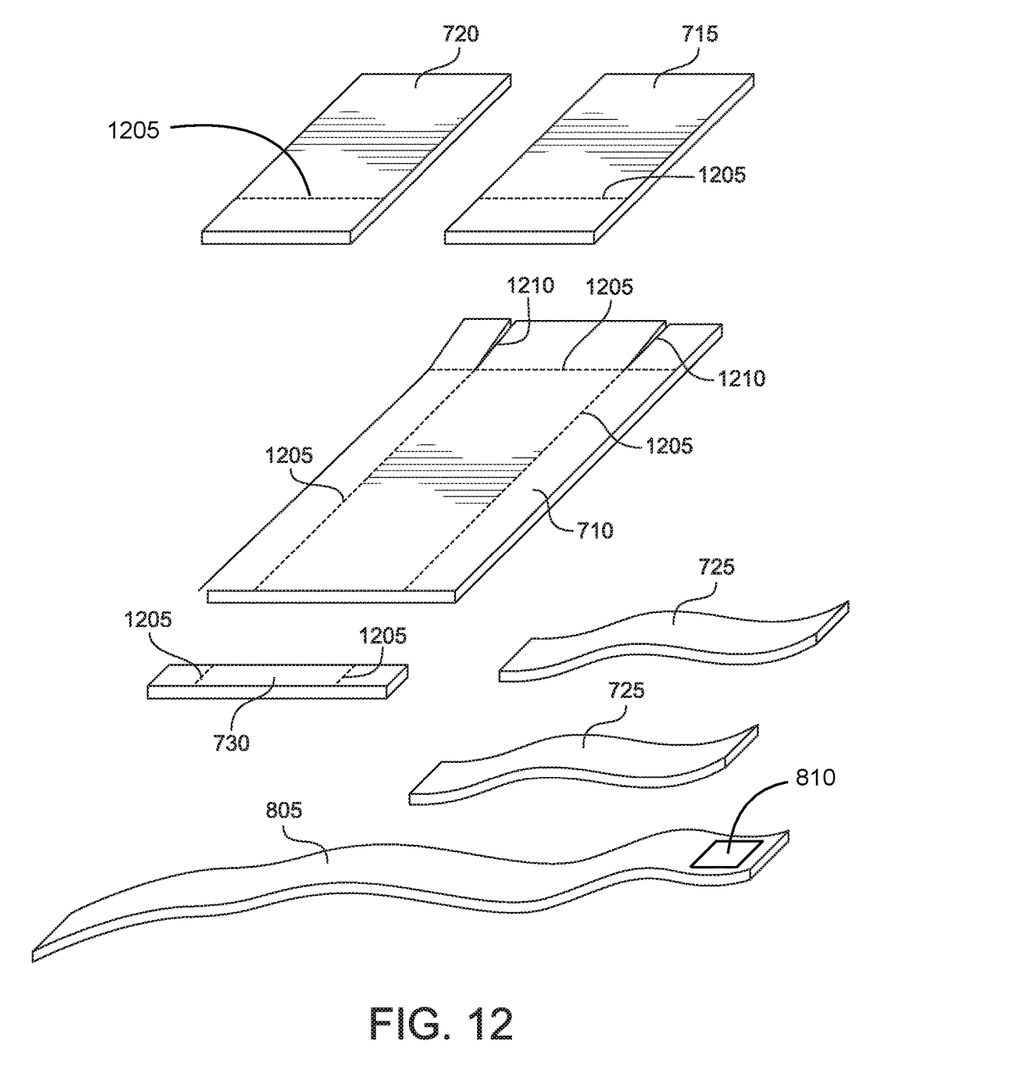
FIG. 12 is a perspective view of key fob sleeve components, according to an embodiment of the invention.
Figure 14:
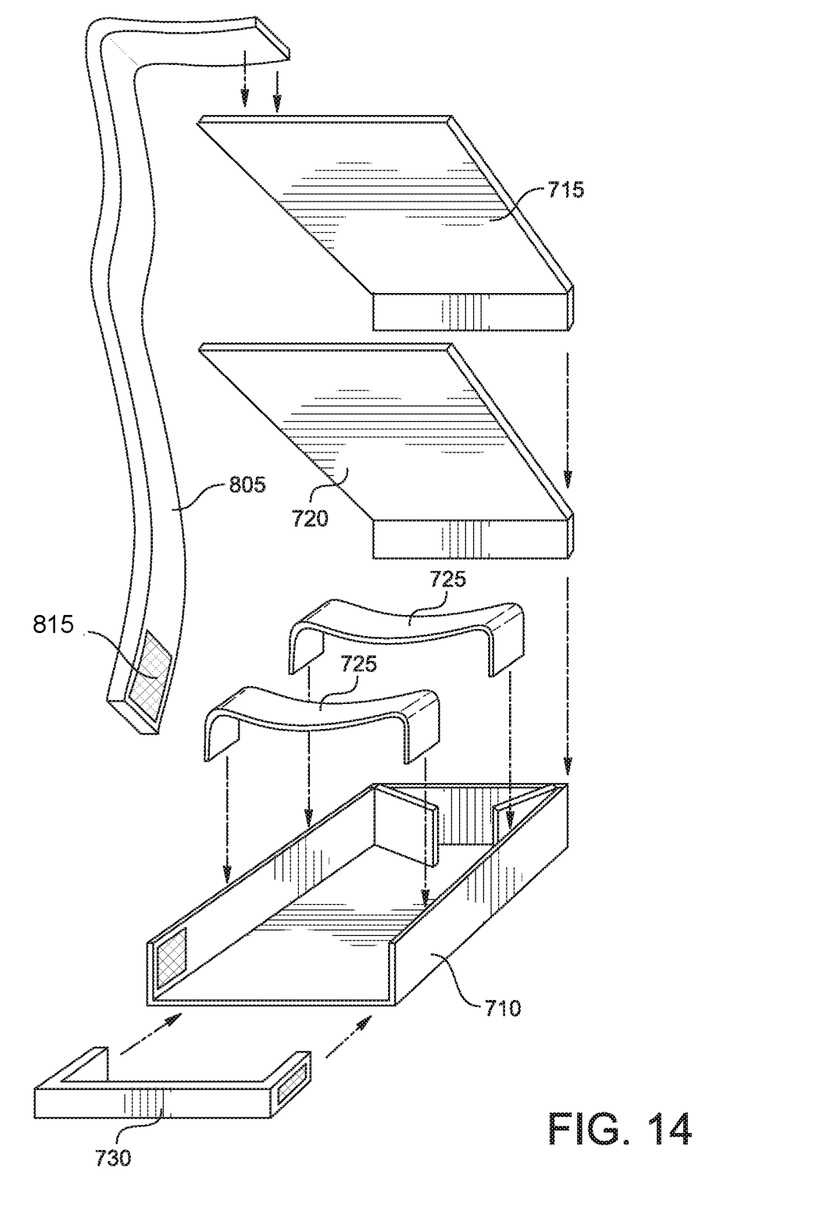
FIG. 14 is an exploded assembly view of a key fob sleeve, according to an embodiment of the invention.
Figure 15:
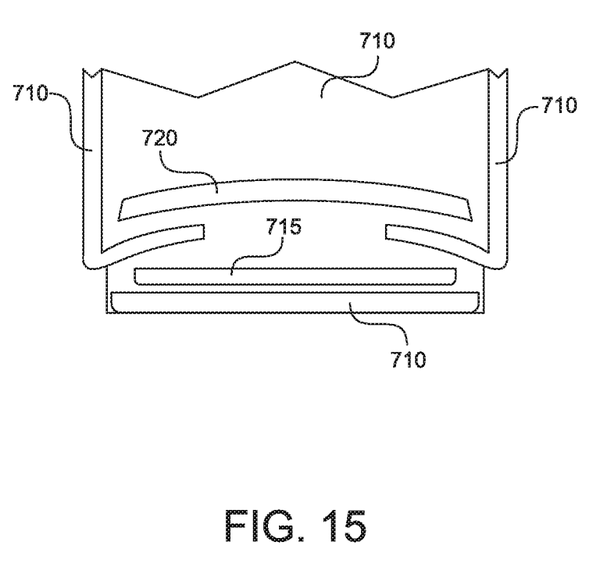
FIG. 15 is a plan view of a portion of a key fob sleeve, according to an embodiment of the invention.

After laminating, the process advances to folding step 1115 where certain components are formed, for instance along folding lines 1205 illustrated in FIG. 12. Individual components are then combined in assembling step 1120, for example as illustrated in FIGS. 14 and 15. An outermost layer can be applied to one or more components in covering step 1125. Assembling step 1120 and covering step 1125 may be performed, for instance, by applying a suitable adhesive or by stitching components together. Binding, trimming, or other finishing can be accomplished in finishing step 1130.

Each layer of the base 710, cover 715, tongue 720 or other multi-layered component of the sleeve 705 may be selected for a particular contribution. For instance, a paper, cardboard, or plastic layer may be used for structural support. A metallic foil (e.g., an aluminum or copper foil) or metallic mesh (e.g., a copper/nickel or other woven metal textile) may be used to block RF signals. A vinyl or leather layer may be laminated on a top and/or bottom surface of a component for enhanced durability and for ornamentation.

Figure 13:
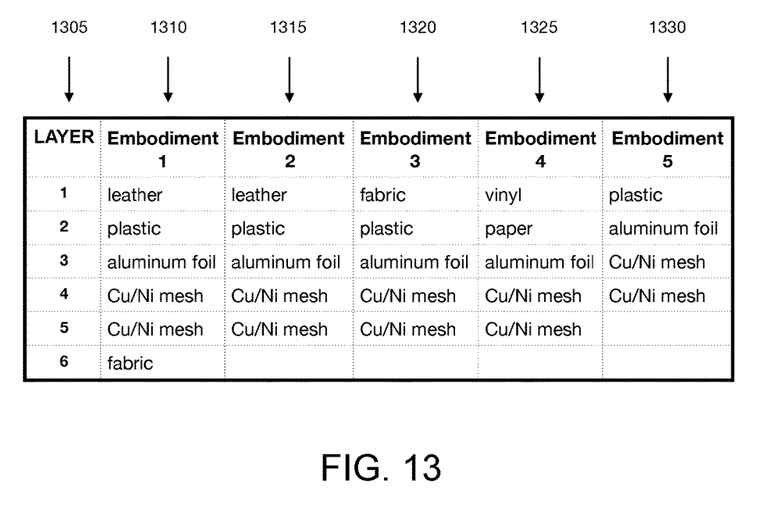
FIG. 13 is an illustration of a table showing alternative layering embodiments.

FIG. 13 provides a table to illustrate exemplary multi-layered approaches. Column 1305 assigns a layer number, where layer 1 is an outer-most layer of a component when used in a sleeve 705. Columns 1310, 1315, 1320, 1325, and 1330 each provide an alternative lamination embodiment. As shown, including both a aluminum foil and two copper/nickel (Cu/Ni) mesh layer in each multi-layered sub-assembly is preferable. But sub-assembly embodiments having a single metallic foil layer, a single metallic mesh layer, or other combinations not shown in FIG. 13 or described above are also possible depending upon application needs.

As indicated above, not all components of a sleeve 705 must be laminated (and multi-layered) sub-assemblies. Moreover, where multiple components of the sleeve 705 are laminated sub-assemblies, such multiple components need not share identical layering construction. In addition, for at least some components of the sleeve 705, the outer-most layer could be applied in either the laminating step 1110 or the covering step 1125. It may be preferable, for example, to apply an outer-most layer of leather or vinyl to multiple components simultaneously in the covering step 1125 rather than separately covering individual components during the laminating step 1110.

SUMMARY

Embodiments of the invention thus provide an improved sleeve for a key fob that limits the risk of certain types of threats related to unauthorized RF communications. Those skilled in the art can readily recognize that numerous variations and substitutions may be made in the invention, its use and its configuration to achieve substantially the same results as achieved by the embodiments described herein. Features disclosed in this specification could be combined in ways not expressly illustrated or discussed. Accordingly, there is no intention to limit the invention to the disclosed exemplary forms and applications. Many variations, modifications and alternative constructions fall within the scope and spirit of the disclosed invention.

I claim:

1. A sleeve for a key fob, comprising:
   a base, the base having a cavity formed by a rectangular floor and three side walls extending from the rectangular floor;
   a cover movably connected to a first of the three side walls;
   at least one retention strap connected between a second and third of the three side walls, the at least one retention strap being elastic; and
   an end strap connected between the second and third of the three side walls, the base and the cover each having at least one metallic layer.

2. The sleeve of claim 1, wherein the end strap is removably connected between the second and third of the three side walls.

3. The sleeve of claim 1, wherein the at least one metallic layer includes:
   a metal foil layer; and
   at least one metallic mesh layer coupled to the metal foil layer.

4. The sleeve of claim 3, wherein the metal foil layer is an aluminum foil layer and the at least one metallic mesh layer is a copper/nickel mesh layer.

5. The sleeve of claim 1, further comprising a tongue movably connected to the first of the three side walls, the tongue having at least one metallic layer, the tongue being disposed between the rectangular floor and the cover when the sleeve is disposed in a closed position.

6. The sleeve of claim 1, further comprising a split ring, the end strap being disposed through an opening in the split ring.

7. A sleeve for a key fob, comprising:
   a base, the base having a cavity formed by a rectangular floor and three side walls extending from the rectangular floor; and
   means for securing the key fob in the sleeve, when the sleeve is in use.

8. The sleeve of claim 7, further comprising:
   a cover movably connected to a first of the three side walls; and
   means for securing the cover to the three side walls of the base, when the sleeve is disposed in a closed position.

* * * * *